United States Patent
Takahashi et al.

(10) Patent No.: US 8,994,164 B2
(45) Date of Patent: Mar. 31, 2015

(54) SEMICONDUCTOR DEVICE AND SEMICONDUCTOR DEVICE MANUFACTURING METHOD

(75) Inventors: Hideaki Takahashi, Omachi (JP); Tatsuya Karasawa, Shiojiri (JP); Yo Sakamoto, Matsumoto (JP)

(73) Assignee: Fuji Electric Co., Ltd., Kawasaki-Shi (JP)

( * ) Notice: Subject to any disclaimer, the term of this patent is extended or adjusted under 35 U.S.C. 154(b) by 0 days.

(21) Appl. No.: 14/351,457

(22) PCT Filed: Sep. 12, 2012

(86) PCT No.: PCT/JP2012/073316
§ 371 (c)(1),
(2), (4) Date: May 12, 2014

(87) PCT Pub. No.: WO2013/058038
PCT Pub. Date: Apr. 25, 2013

(65) Prior Publication Data
US 2014/0246769 A1 Sep. 4, 2014

(30) Foreign Application Priority Data

Oct. 18, 2011 (JP) .................................. 2011-228743

(51) Int. Cl.
*H01L 23/48* (2006.01)
*H01L 23/498* (2006.01)
*H01L 25/07* (2006.01)
*H01L 25/18* (2006.01)
(Continued)

(52) U.S. Cl.
CPC .......... *H01L 23/49838* (2013.01); *H01L 25/07* (2013.01); *H01L 25/18* (2013.01); *H05K 5/00* (2013.01); *H05K 7/06* (2013.01); *H01L 23/49811* (2013.01); *H01L 23/057* (2013.01); *H01L 21/4875* (2013.01); *H01L 2924/0002* (2013.01)
USPC .......................................... 257/692; 438/125

(58) Field of Classification Search
CPC ............ H01L 23/057; H01L 23/49811; H01L 23/49838; H01L 23/49861; H01L 23/50; H01L 21/4875
USPC ................... 257/688, 691, 692; 438/117, 125
See application file for complete search history.

(56) References Cited

U.S. PATENT DOCUMENTS 5,455,456 A * 10/1995 Newman ........................ 257/704
5,512,782 A 4/1996 Kobayashi
(Continued)

FOREIGN PATENT DOCUMENTS

JP H08-204115 A 8/1996
JP H09-331018 A 12/1997
(Continued)

OTHER PUBLICATIONS

PCT, "International Search Report for International Application No. PCT/JP2012/073316".
(Continued)

*Primary Examiner* — Fernando L Toledo
*Assistant Examiner* — Bryan Junge
(74) *Attorney, Agent, or Firm* — Manabu Kanesaka

(57) ABSTRACT

A semiconductor device includes an insulating substrate having a semiconductor element mounted thereon; an outer case accommodating the insulating substrate; and a metallic terminal bar disposed above the insulating substrate and fixed to side walls of the outer case at both ends thereof. Each of both ends of the terminal bar at a position close to the side wall of the outer case at a surface on an opposite side to a surface facing the insulating substrate is provided with a pressed groove.

8 Claims, 10 Drawing Sheets

(51) Int. Cl.
*H05K 5/00* (2006.01)
*H05K 7/06* (2006.01)
*H01L 23/057* (2006.01)
*H01L 21/48* (2006.01)

(56) References Cited

U.S. PATENT DOCUMENTS 7,474,007 B2 * 1/2009 Yoshiike ............... 257/784
2006/0138633 A1 * 6/2006 Naruse et al. ......... 257/688

FOREIGN PATENT DOCUMENTS

| JP | 2004-221516 A | 8/2004 |
| JP | 2009-004685 A | 1/2009 |
| JP | 2010-212620 A | 9/2010 |

OTHER PUBLICATIONS

V-Series Intelligent Power Modules; Fuji Electric Journal vol. 82, No. 6 2009.

* cited by examiner

UPWARD DEFORMATION

DOWNWARD DEFORMATION

33b PRESSED GROOVE

30 TERMINAL BAR

33c PRESSED GROOVE

30 TERMINAL BAR

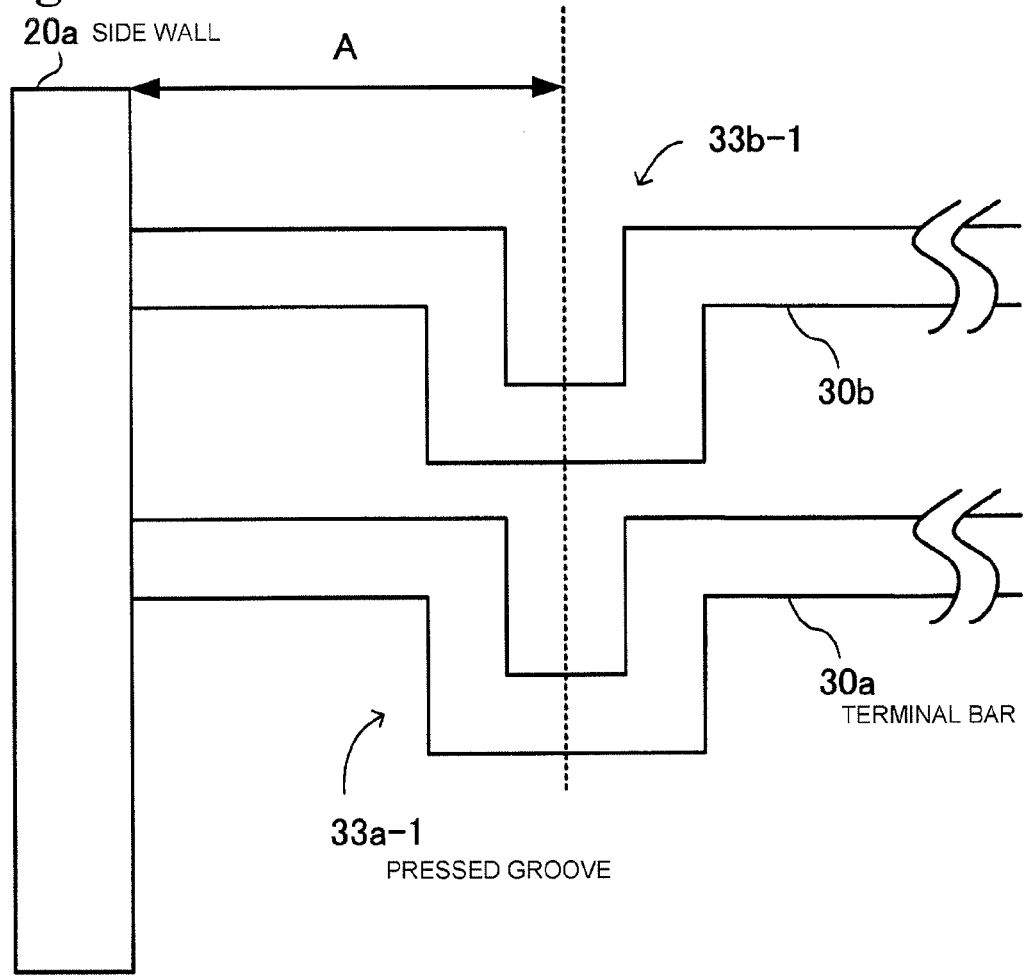

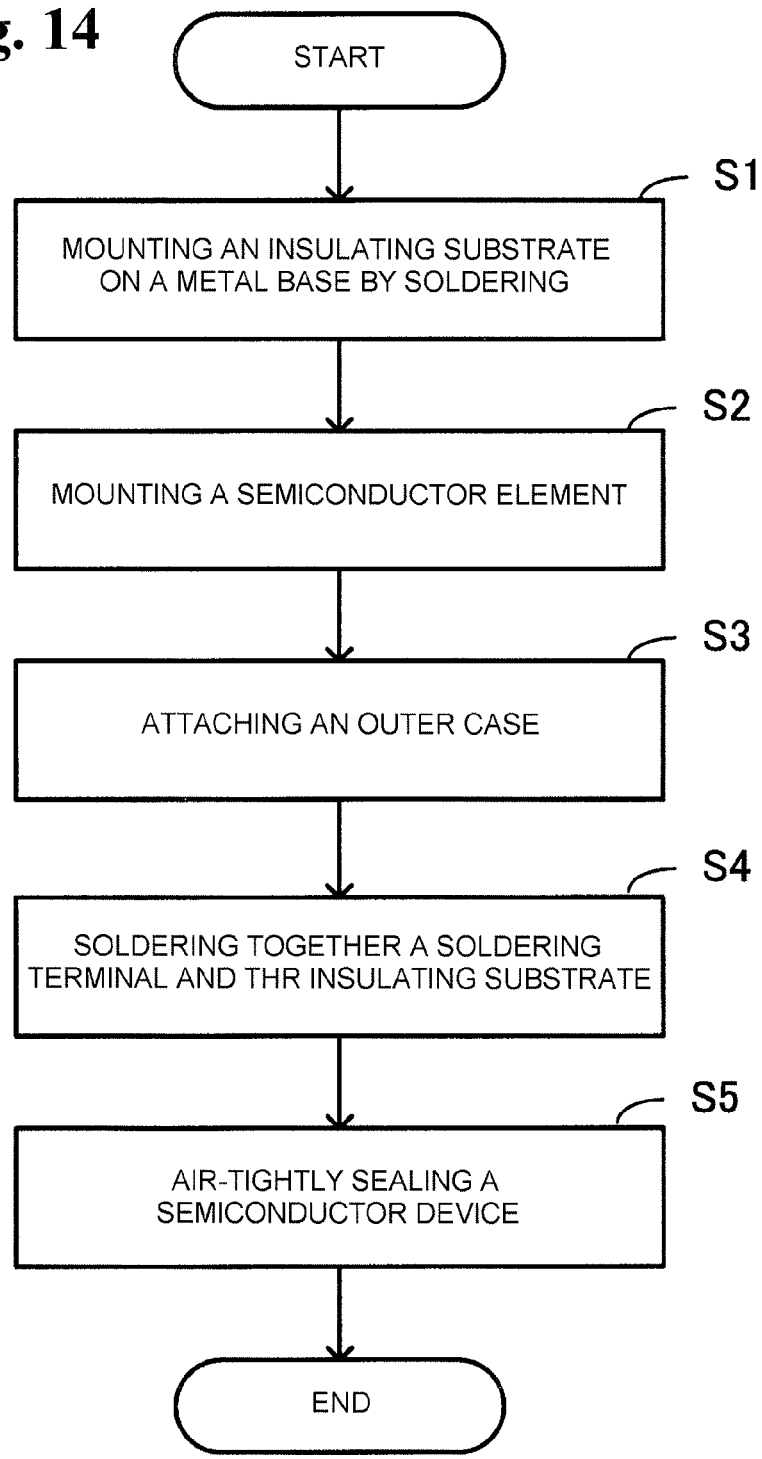

US 8,994,164 B2

SEMICONDUCTOR DEVICE AND SEMICONDUCTOR DEVICE MANUFACTURING METHOD

RELATED APPLICATIONS

The present application is National Phase of International Application No. PCT/JP2012/073316 filed Sep. 12, 2012, and claims priority from Japanese Application No. 2011-228743 filed Oct. 18, 2011.

TECHNICAL FIELD

The present invention relates to a semiconductor device having a semiconductor element such as a power semiconductor element (IGBT: Insulated Gate Bipolar Transistor), and a semiconductor device manufacturing method for manufacturing the semiconductor device.

BACKGROUND ART

A semiconductor device typically has a structure in which a semiconductor element and an insulating substrate mounted on a metallic base plate for heat radiation are wire bonded together and those components are covered by an outer case.

In the widely used type of the main shape of the outer case, outer terminals of the same polarity are provided at two locations on the opposing two sides, among the four circumferential sides of the outer case, and the external terminals on the opposing sides are connected by a terminal bar. A terminal section for connecting to the insulating substrate is formed at the terminal bar.

When a semiconductor device is manufactured using such an outer case, first, the insulating substrate with a semiconductor element mounted thereon is positioned in the outer case, and the metallic base plate carrying the insulating substrate is attached to the outer case with an adhesive. Then, the terminal section of the terminal bar provided at the outer case and the insulating substrate are soldered together by paste soldering.

In the conventional semiconductor device, a pair of positive and negative DC input terminals is arranged, so that same polarities face each other at two opposing side of a package accommodating a semiconductor element (Patent Document 1).

Patent Document 1: Japanese Patent Application Publication No. H7-111310

When the insulating substrate with the semiconductor element mounted thereon is accommodated in the outer case and the terminal section of the terminal bar and the insulating substrate are soldered together, the metallic terminal bar undergoes thermal expansion due to heating that accompanies soldering.

In this case, since both ends of the terminal bar are fixed, the terminal bar that is flat at a normal temperature is deformed by thermal expansion and a clearance (gap) can occur between the terminal section of the terminal bar and the insulating substrate. Problems encountered when the clearance occurs between the terminal section of the terminal bar and the insulating substrate include degradation of solderability and occurrence of connection defects.

DISCLOSURE OF THE INVENTION

With the foregoing, the objective of the present invention is to provide a semiconductor device such that solderability is stabilized and connection defects are prevented.

Another objective of the present invention is to provide a semiconductor device manufacturing method such that solderability is stabilized and connection defects are prevented.

In order to solve the abovementioned problem, a semiconductor device is provided. The semiconductor device includes an insulating substrate having a semiconductor element mounted thereon; an outer case accommodating the insulating substrate; and a metallic terminal bar disposed above the insulating substrate and fixed to side walls of the outer case at two ends thereof. Each of the two ends of the terminal bar at a position close to the side wall of the outer case at a surface on an opposite side to a surface facing the insulating substrate is provided with a pressed groove.

The semiconductor device has a configuration including the insulating substrate, the outer case, and the metallic terminal bar fixed to side walls of the outer case at two ends thereof, in which each of the two ends of the terminal bar at a position close to the side wall of the outer case at a surface on an opposite side to a surface facing the insulating substrate is provided with a pressed groove. As a result, during heating of the soldering, solderability can be stabilized and connection defects can be prevented.

In the semiconductor device manufacturing method, an insulating substrate is accommodated in an outer case having a metallic terminal bar disposed above the insulating substrate and being fixed at two ends to side walls of the outer case. The terminal bar is provided with a pressed groove at each of the two ends of the terminal bar at a position close to the side wall at a surface on an opposite side to a surface facing the insulating substrate. As a result, during heating in soldering, solderability can be stabilized and connection defects can be prevented.

The above-described and other objectives, features and advantages of the present invention will be made apparent from the explanation below that is associated with the appended drawings illustrating the preferred embodiment as an example of the present invention.

BRIEF DESCRIPTION OF THE DRAWINGS

FIG. 13 shows pressed grooves located in the same position.
FIG. 14 is a flowchart illustrating a semiconductor device manufacturing method.

BEST MODE FOR CARRYING OUT THE INVENTION

Figure 1:
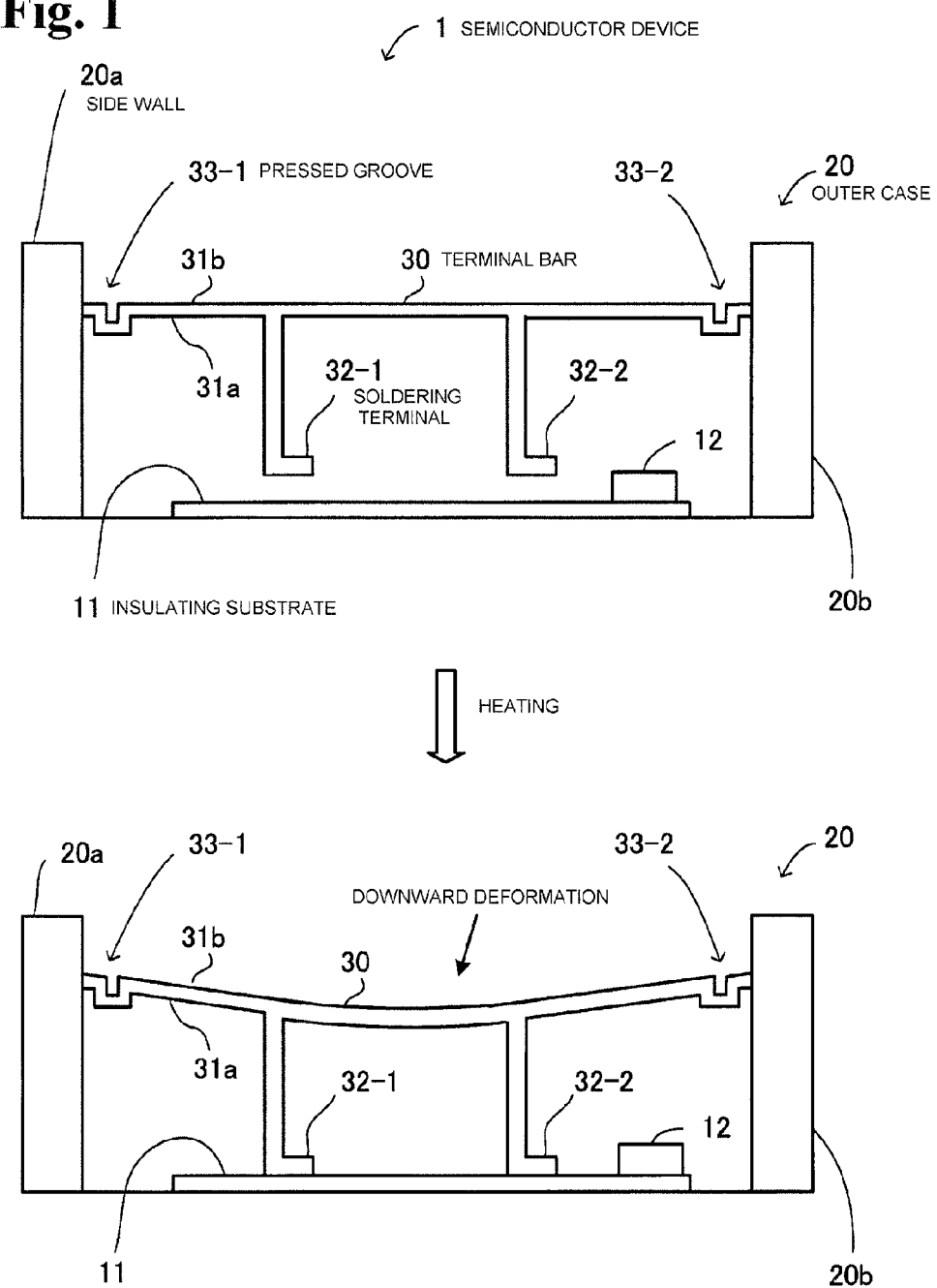
FIG. 1 shows a configuration example of a semiconductor device.

Embodiments of the present invention will be explained below with reference to the appended drawings. FIG. 1 shows a configuration example of a semiconductor device. A semiconductor device 1 is provided with an insulating substrate 11 and an outer case 20. A semiconductor element 12 is mounted on the insulating substrate 11. The outer case 20 accommodates the insulating substrate 11.

A terminal bar 30 made from a metal (for example, from copper) and fixed at both ends to side walls 20a, 20b of the outer case 20 is provided above the insulating substrate 11. Terminal sections 32-1, 32-2 protruding toward the insulating substrate 11 are formed at the terminal bar 30.

Further, pressed grooves 33-1, 33-2 obtained by press groove processing are provided at both ends of the terminal bar 30. The pressed grooves 33-1, 33-2 are present at a surface 31b, which is the upper surface of the terminal bar 30 and is on the side opposite to that of a surface 31a facing the insulating substrate 11. The pressed grooves are provided at positions in the vicinity of the side walls 20a, 20b of the outer case 20.

When the terminal sections 32-1, 32-2 and the insulating substrate 11 are soldered together, the metallic terminal bar 30 is deformed due to thermal expansion induced by heating that accompanies soldering. However, since the pressed grooves 33-1, 33-2 are provided at the above-described positions, the terminal bar 30 is deformed toward the lower side where the insulating substrate 11 is positioned.

Thus, the pressed grooves 33-1, 33-2 fixedly determine the thermal deformation direction so that when the terminal sections 32-1, 32-2 and the insulating substrate 11 are soldered together, the terminal bar 30 is deformed toward the lower side where the insulating substrate 11 is positioned and the terminal bar 30 comes close to the insulating substrate 11 due to heating during soldering.

As a result, the occurrence of a clearance between the terminal sections 32-1, 32-2 of the terminal bar 30 and the insulating substrate 11 during heating at the time of soldering can be inhibited; therefore, the stability of solderability can be improved and the occurrence of connection defects can be prevented.

Figure 2:
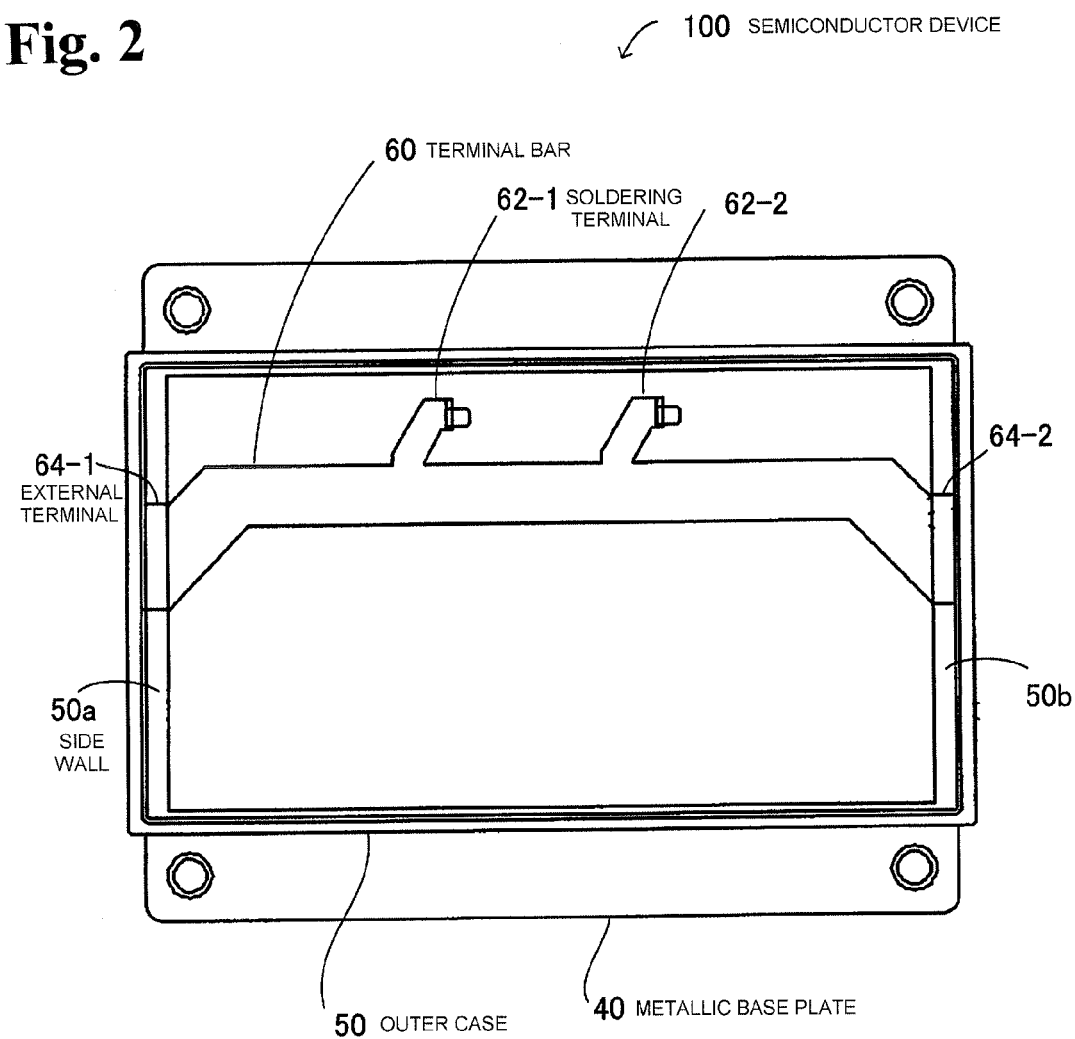
FIG. 2 is a plan view of the semiconductor device.
Figure 3:
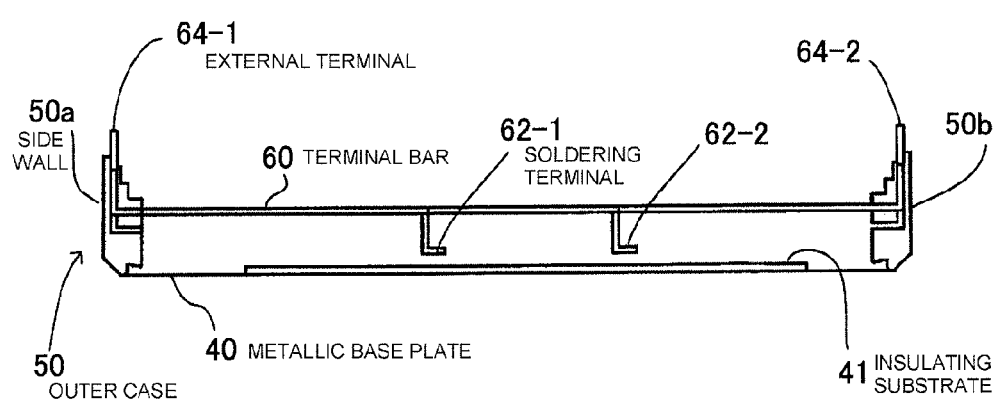
FIG. 3 is a cross-sectional view of the semiconductor device.

The configuration of a semiconductor device provided with a typical outer case will be explained below. FIG. 2 is a plan view of the semiconductor device, and FIG. 3 is a cross-sectional view of the semiconductor device. A semiconductor device 100 is provided with a metal base plate 40 for heat radiation, an insulating substrate 41, and an outer case 50.

In the semiconductor device 100, the insulating substrate 41 is carried on the metal base plate 40, and the outer case 50 is bonded to the metal base plate 40. A semiconductor element (not shown in the figure) is mounted on the insulating substrate 41.

The outer case 50 is molded from a resin and has metallic external terminals 64-1, 64-2 and a terminal bar 60. The external terminals 64-1, 64-2 and the terminal bar 60 are obtained by processing and forming a metal sheet, for example a copper sheet, and are electrically connected.

External terminals 64-1, 64-2 of the same polarity are provided on two opposing sides from among the four circumferential sides of the outer case 50. The terminal bar 60 is molded integrally with the outer case 50 and fixed to side walls 50a, 50b with a resin in two locations at both ends thereof. The terminal bar 60 may be disposed in the outer case 50 so that when the outer case 50 is placed on the metal base plate 40 at a normal temperature, the surface thereof becomes parallel to the insulating substrate 41.

The terminal bar 60 is provided with terminal sections 62-1, 62-2 for internal wiring. The terminal sections 62-1, 62-2 are formed in a state of protruding toward the lower side where the insulating substrate 41 is positioned. The terminal sections 62-1, 62-2 protruding from the terminal bar 60 and the insulating substrate 41 are soldered together by paste soldering.

As a result of the terminal sections 62-1, 62-2 and the insulating substrate 41 being soldered together, the external terminals 64-1, 64-2 protruding from the outer case 50 electrically contact the insulating substrate 41 where a circuit pattern or a conductive material is disposed. Therefore, the insulating substrate 41 having mounted thereon the semiconductor element located in the semiconductor device 100 can be electrically connected by the external terminals 64-1, 64-2 to the external other system.

Figure 4:
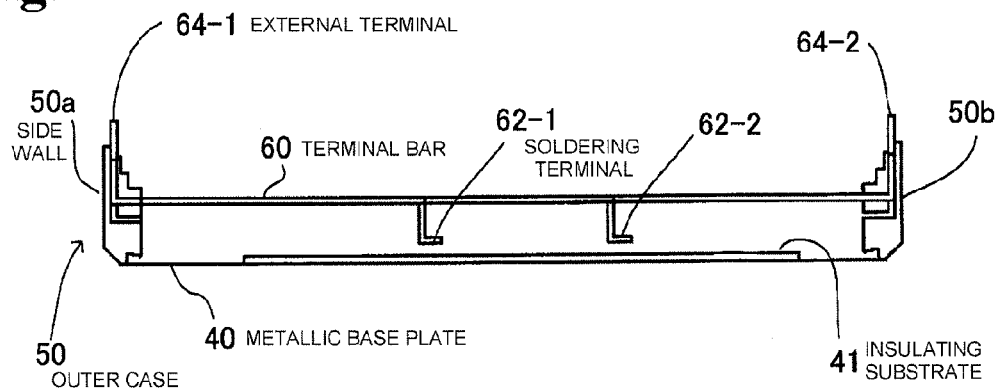
FIG. 4 illustrates the deformation of a terminal bar.
Figure 5:
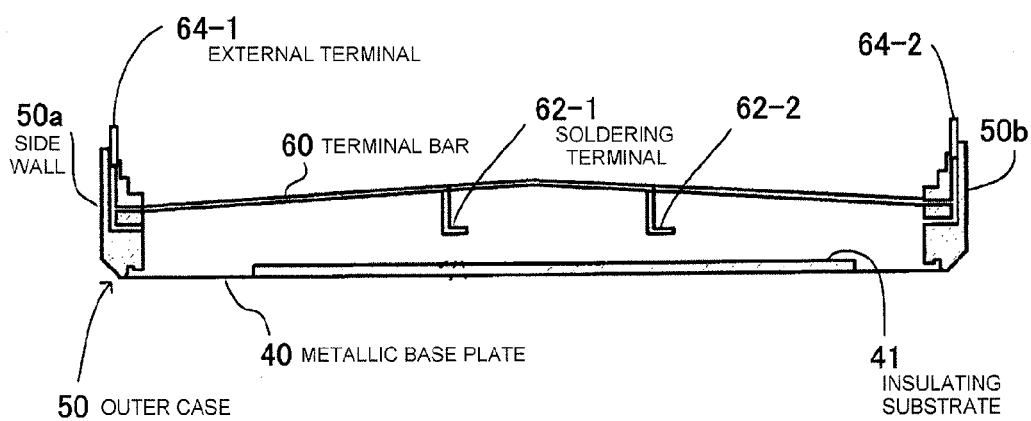
FIG. 5 illustrates the deformation of a terminal bar.
Figure 6:
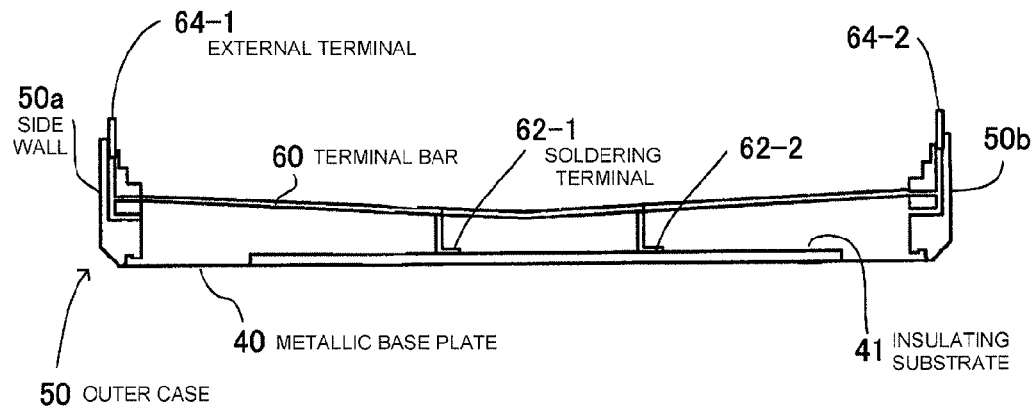
FIG. 6 illustrates the deformation of a terminal bar.

The deformation caused by heating of the metallic terminal bar will be explained below. FIGS. 4 to 6 illustrate the deformation of the terminal bar. FIG. 4 shows a state (the state without thermal deformation) in which the terminal bar 60 is at a position parallel to the insulating substrate 40 at a normal temperature (for example, 25° C.)

FIGS. 5 and 6 illustrate a state in which the terminal bar 60 is thermally deformed by heating. When the insulating substrate 41 having the semiconductor element mounted thereon is assembled with the outer case 50, and the terminal sections 62-1, 62-2 provided at the terminal bar 60 are soldered with the insulating substrate 41, the metallic terminal bar 60 is heated and thermally expanded due to heating during soldering.

Since both ends of the terminal bar 60 are fixed, in the normal-temperature state, the terminal bar 60 which is parallel to the insulating substrate 41 is deformed only by thermal expansion. In the configuration shown in FIG. 5, due to the thermal expansion of the terminal bar 60 caused by heating during soldering, the terminal bar 60 is deformed upward, which is opposite to the direction where the insulating substrate 41 is positioned, and bends to withdraw from the insulating substrate 41.

Meanwhile, in the configuration shown in FIG. 6, due to the thermal expansion of the terminal bar 60 caused by heating during soldering, the terminal bar 60 is deformed downward toward the insulating substrate 41 and bends to approach the insulating substrate 41.

Thus, because the terminal bar 60 is fixed to the side walls 50a, 50b of the outer case 50, where the metal thermally expands under heating, the terminal bar 60 which is parallel to the insulating substrate 41 deforms upward or downward and bends.

Therefore, in the case in which the terminal bar 60 deforms downward in the direction toward the insulating substrate 41 and comes close thereto, as shown in FIG. 6, due to the heating associated with soldering when the terminal sections 62-1, 62-2 and the insulating substrate 41 are soldered together, a clearance does not appear between the terminal sections 62-1, 62-2 and the insulating substrate 41.

By contrast, in the case in which the terminal bar 60 deforms upward in the direction opposite to the location where the insulating substrate 41 is located and recedes therefrom, as shown in FIG. 5, due to the heating associated with soldering when the terminal sections 62-1, 62-2 and the insulating substrate 41 are soldered together, a clearance can appear between the terminal sections 62-1, 62-2 and the insulating substrate 41.

Thus, in the conventional semiconductor device 100, a clearance sometimes appears between the terminal sections 62-1, 62-2 and the insulating substrate 41 due to the heating associated with soldering when the terminal sections 62-1, 62-2 and the insulating substrate 41 are soldered together.

Where a clearance thus appears between the terminal sections 62-1, 62-2 and the insulating substrate 41, solderability is degraded and connection defects occur. The present technique has been created with the foregoing in view and an object thereof is to provide a semiconductor device and a semiconductor device manufacturing method such that solderability is stabilized and the occurrence of connection defects is prevented during heating in soldering.

Figure 7:
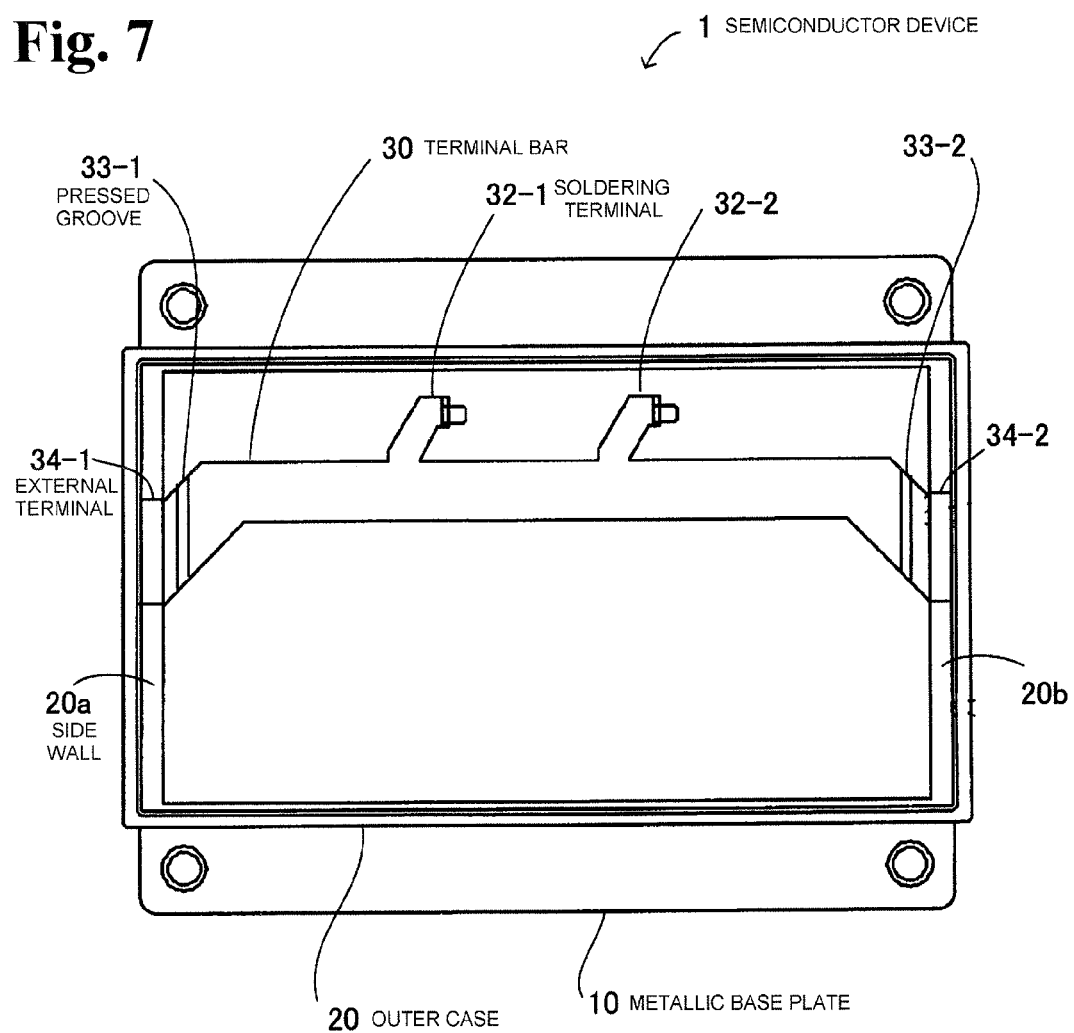
FIG. 7 is a plan view of the semiconductor device.
Figure 8:
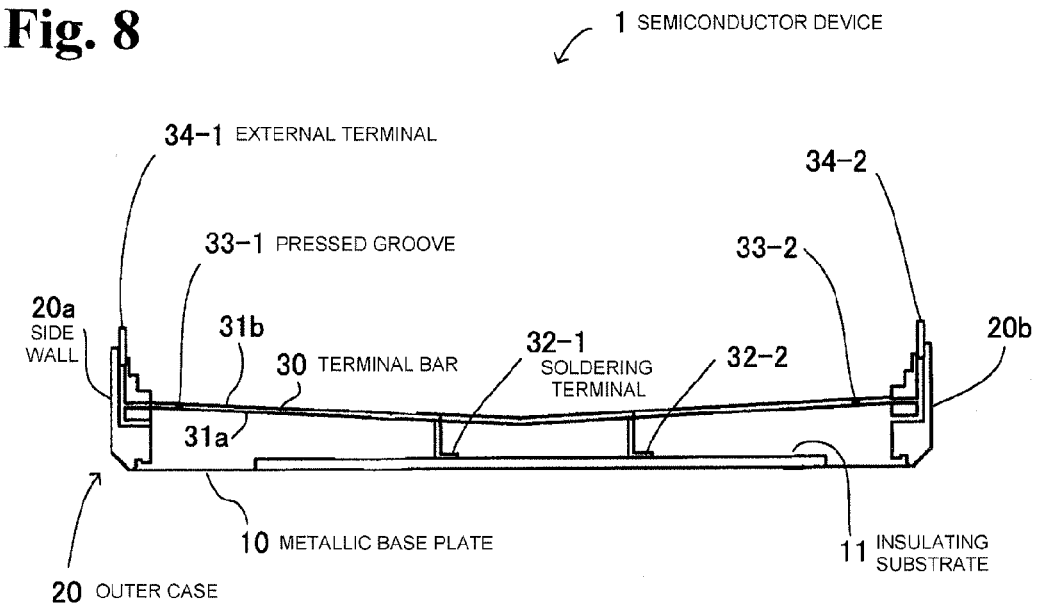
FIG. 8 is a cross-sectional view of the semiconductor device.

The configuration of a semiconductor device 1 will be explained below in greater detail. FIG. 7 is a plan view of the semiconductor device. FIG. 8 is a cross-sectional view of the semiconductor device. The semiconductor device 1 is provided with a metal base plate 10 for heat radiation, an insulating substrate 11, and an outer case 20.

In the semiconductor device 1, the insulating substrate 11 is placed on the metal base plate 10, and the outer case 20 is bonded to the metal base plate 10. A semiconductor element (not shown in the figure) is mounted on the insulating substrate 11.

The outer case 20 is molded from a resin and provided with metallic external terminals 34-1, 34-2 and a terminal bar 30. The external terminals 34-1, 34-2 and the terminal bar 30 are obtained by processing and forming a metal sheet, for example a copper sheet, and are electrically connected.

External terminals 34-1, 34-2 of the same polarity are provided on two opposing sides from among the four circumferential sides of the outer case 20. The terminal bar 30 is molded integrally with the outer case 20 and fixed to side walls 20a, 20b with a resin in two locations at both ends thereof. The terminal bar 30 may be disposed in the outer case 20 so that when the outer case 20 is placed on the metal base plate 10 at a normal temperature, the surface thereof becomes parallel to the insulating substrate 11.

The terminal bar 30 is provided with terminal sections 32-1, 32-2 for internal wiring. The terminal sections 32-1, 32-2 are formed in a state of protruding toward the lower side where the insulating substrate 11 is positioned. The terminal sections 32-1, 32-2 protruding from the terminal bar 30 and the insulating substrate 11 are soldered together by paste soldering.

As a result of the terminal sections 32-1, 32-2 and the insulating substrate 11 being soldered together, the external terminals 34-1, 34-2 protruding from the outer case 20 electrically contact the insulating substrate 11 where a circuit pattern or a conductive material is disposed. Therefore, the insulating substrate 11 having mounted thereon the semiconductor element located in the semiconductor device 1 can be electrically connected by the external terminals 34-1, 34-2 to the external other system.

In this configuration, press groove processing is performed at positions in the vicinity of the side walls 20a, 20b of the outer case 20 at both ends of the terminal bar 30 at a surface 31b which is on the side opposite to that of a surface 31a facing the insulating substrate 11. Each of a total of two pressed grooves (slits) 33-1, 33-2 is provided at the end section between a fixed end where the terminal bar 30 is fixed to the outer case 20 and the terminal section 32-1 or 32-2.

As a result of providing such pressed grooves 33-1, 33-2 in the terminal bar 30, the deformation of the terminal bar 30 caused by thermal expansion that occurs during heating in soldering is always in the downward direction toward the insulating substrate 11, and the terminal bar bends so as to approach the insulating substrate 11.

Figure 9:
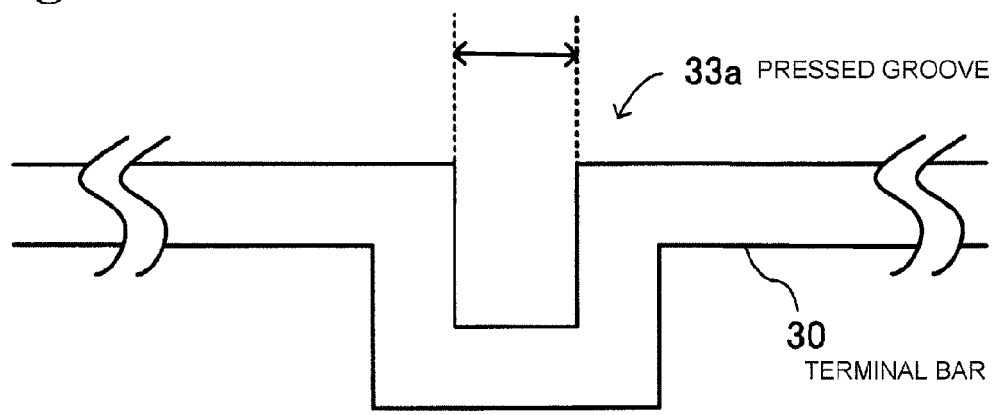
FIG. 9 shows a pressed groove.

The shape of the pressed groove will be explained below. FIG. 9 shows the pressed groove. A quadrangular pressed groove 33a is shown. With the quadrangular shape, the pressed groove processing can be easily performed. The width of the pressed groove 33a (groove width) is equal to or greater than 1 mm.

Figure 10:
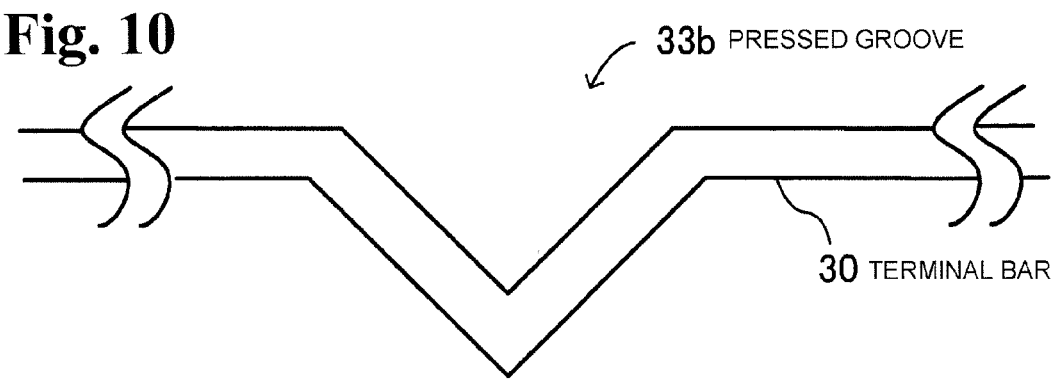
FIG. 10 shows a pressed groove.
Figure 11:
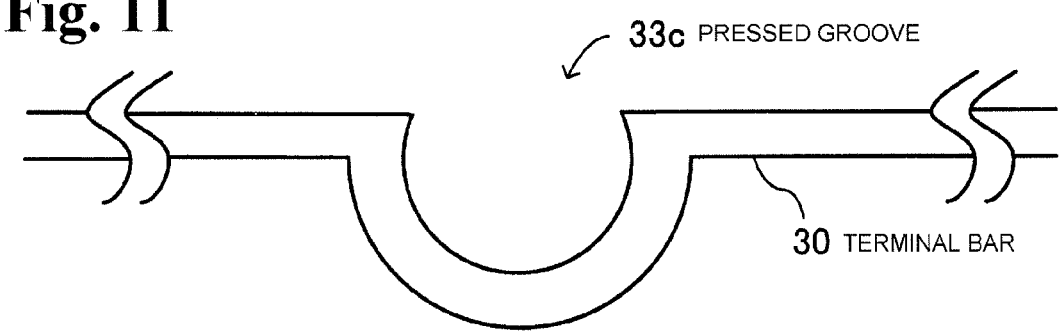
FIG. 11 shows a pressed groove.

FIG. 10 and FIG. 11 show pressed grooves. A pressed groove 33b shown in FIG. 10 has a triangular shape, and a pressed groove 33c shown in FIG. 11 has a round shape.

When those pressed grooves are formed, the terminal bar 30 is pressed, and bent so that the recesses of the grooves are open on the side opposite to that of the insulating substrate 11. Further, the pressed grooves are formed such that the protrusion on the bottom side of the groove protrudes toward the insulating substrate 11, but a non-protruding shape may be also used. In addition to a single continuous configuration of the pressed groove, a dot line, broken line, wavy line, or zigzag line configuration may be used.

Described above is an example of the pressed groove shape, but any pressed groove shape may be used provided that this shape fixedly defines the thermal deformation direction of the pressed grooves, such that the terminal bar 30 is at all times deformed downward toward the insulating substrate 11 by thermal expansion and approaches the insulating substrate 11.

The pressed groove of the above-described shape is provided by performing press groove processing on the surface 31b on the side opposite to that of the surface 31a facing the insulating substrate 11. Further, the pressed grooves are provided close to the resin surfaces at both ends where the terminal bar 30 is fixed (or close to the external terminals 34-1, 34-2 positioned at both ends of the terminal bar 30). The distance between the pressed groove and the resin surface is, for example, about 1.5 mm.

As a result of performing such pressed groove processing at both ends of the terminal bar 30, it is possible to control the deformation direction induced by thermal expansion, so that the terminal bar is deformed downward so as to approach the insulating substrate 11. Therefore, the deformation direction of the terminal bar 30 is unified such that the terminal sections 32-1, 32-2 always approach the insulating substrate 11. As a result, the appearance of a clearance between the terminal sections 32-1, 32-2 and the insulating substrate 11 can be inhibited.

Explained hereinabove is the case in which one pressed groove is provided in the end section of the terminal bar 30 (a total of two pressed grooves in both ends), but a configuration may be also used in which a plurality of pressed grooves is provided in the end sections of the terminal bar 30.

It is also possible to form the pressed grooves in the end sections of the terminal bar 30 in the vicinity of the fixing ends where the terminal bar is fixed to the outer case 20 at a distance from the terminal sections 32-1, 32-2, so that the bottom sections of the plurality of terminal sections 32-1, 32-2 and the insulating substrate 11 be parallel to each other when the terminal bar 30 is thermally deformed.

Figure 12:
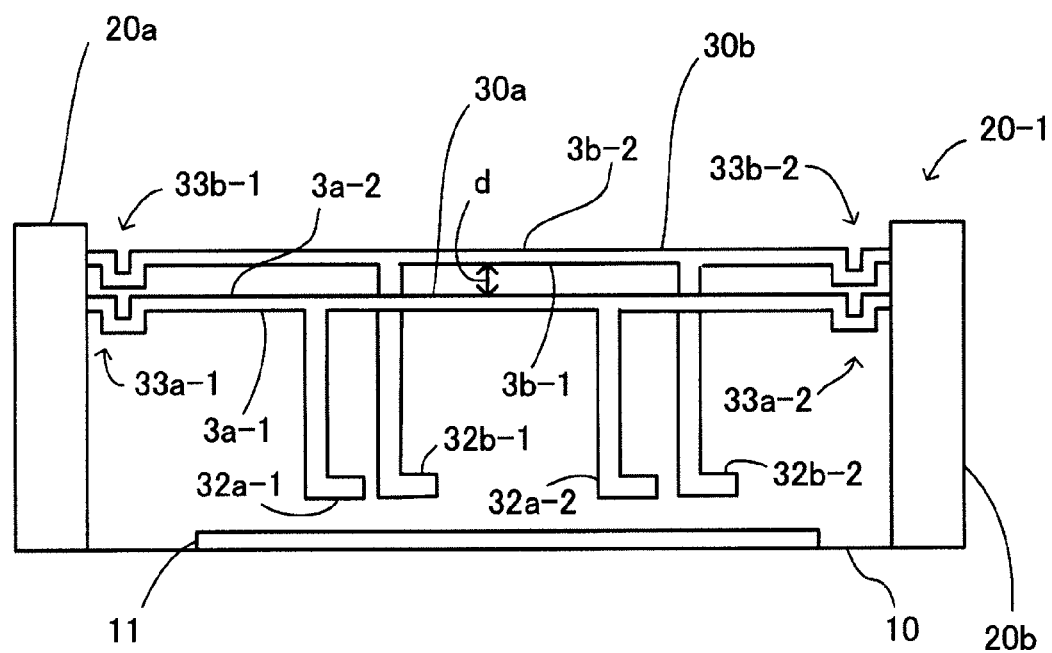
FIG. 12 shows a configuration example of a semiconductor device.

A deformation example will be explained below. The deformation example relates to a case in which a semiconductor device has an outer case provided with a plurality of terminal bars stacked in a layered configuration with a constant spacing therebetween. FIG. 12 illustrates a configuration example of a semiconductor device. The semiconductor device 1-1 is provided with a metal base plate 10 for heat radiation, an insulating substrate 11, and an outer case 20-1.

The basic configuration of the semiconductor device 1-1 is the same as that of the semiconductor device 1 shown in FIGS. 1, 7, and 8 and mainly differs therefrom in that two terminal bars 30a, 30b are provided and the terminal bars 30a, 30b are parallel to each other, with a constant spacing being provided therebetween, and fixed to the opposing side walls of the outer case 20-1 (FIG. 12 shows an example with two terminal bars).

In the terminal bar 30a, two pressed grooves 33a-1, 33a-2 are provided at both ends by performing pressed groove processing on a surface 3a-2, which is on the side opposite to that of a surface 3a-1 facing the insulating substrate 11, in the vicinity of side walls 20a, 20b of the outer case 20-1. Further, terminal sections 32a-1, 32a-2 for connection to the insulating substrate 11 are formed at the terminal bar 30a.

Likewise, in the terminal bar 30b, two pressed grooves 33b-1, 33b-2 are provided at both ends by performing pressed groove processing on a surface 3b-2, which is on the side opposite to that of a surface 3b-1 facing the insulating substrate 11, in the vicinity of side walls 20a, 20b of the outer case 20-1. Further, terminal sections 32b-1, 32b-2 for connection to the insulating substrate 11 are formed at the terminal bar 30b.

The pressed groove processing of the terminal bars 30a, 30b is performed such that the deformation direction of the terminal bars 30a, 30b that is induced by thermal expansion caused by heating during soldering is always downward and the terminal bars 30a, 30b are bent toward the insulating substrate 11.

In this case, the pressed grooves 33a-1, 33a-2 of the terminal bar 30a and the pressed grooves 33b-1, 33b-2 of the terminal bar 30b should be provided at the same position. FIG. 13 shows the pressed grooves located at the same position. For example, the pressed groove 33a-1 of the terminal bar 30a is at a distance A from the side wall 20a of the outer case 20-1.

In this case, the pressed groove 33b-1 of the terminal bar 30b is also formed in a location at a distance A from the side wall 20a of the outer case 20-1. The same arrangement is used for the pressed grooves 33a-2, 33b-2 on the other side (this arrangement is not shown in the figure).

Where the pressed groove processing position of the terminal bar 30a is different from that of the terminal bar 30b, the terminal bars 30a, 30b have different deformation amounts (degree of bending) caused by thermal expansion of the metal during heating and can contact each other.

Therefore, in the outer case in which a plurality of terminal bars 30a, 30b is provided in a stacked configuration with a constant spacing therebetween, the pressed grooves 33a-1, 33a-2 of the terminal bar 30a and the pressed grooves 33b-1, 33b-2 of the terminal bar 30b are provided at the same positions.

As a result, during soldering of the terminal sections 32a-1, 32a-2 formed at the terminal bar 30a and the insulating substrate 11 and during soldering of the terminal sections 32b-1, 32b-2 formed at the terminal bar 30b and the insulating substrate 11, the terminal bars 30a, 30b bend in the same direction and to the same deformation amount.

Thus, the terminal bars 30a, 30b can be bent in the same direction and to the same deformation amount, so as to approach the insulating substrate 11 in the downward direction, while a constant spacing is maintained between the terminal bars 30a and 30b and the terminal bars do not contact each other.

The process for manufacturing the semiconductor device 1 will be described below by using a flowchart. FIG. 14 is a flowchart illustrating a method for manufacturing the semiconductor device.

[S1] The insulating substrate 11 is mounted by soldering on the metal base plate 10.

[S2] The semiconductor element 12 is mounted on the insulating substrate 11.

[S3] The outer case 20 is attached to the metal base plate 10. The outer case 20 is provided with a metal terminal bar 30 in which pressed grooves 33-1, 33-2 are provided at both ends at positions close to the side walls 20a, 20b on the surface 31b which is on the side opposite to that of the surface 31a facing the insulating substrate 11.

The pressed grooves 33-1, 33-2 define the thermal deformation direction such that when the terminal sections 32-1, 32-2 and the insulating substrate 11 are soldered together, the terminal bar 30 deforms downward toward the insulating substrate due to heating during soldering and the terminal bar 30 approaches the insulating substrate 11.

[S4] The insulating substrate 11 and the terminal sections 32-1, 32-2 formed at the terminal bar 30 are soldered together. During soldering of the terminal sections 32-1, 32-2 formed at the terminal bar 30 and the insulating substrate 11, the terminal bar 30 is deformed downward toward the insulating substrate 11 by heating, which accompanies soldering, and approaches the insulating substrate 11.

[S5] The semiconductor element 12 and the insulating substrate 11 located inside the semiconductor device 1 are air-tightly sealed and the upper lid of the outer case 20 is fixedly attached with the adhesive.

As explained hereinabove, in accordance with the present invention, the terminal bar is subjected to pressed groove processing, and the direction of thermal expansion deformation of the terminal bar occurring during heating, which accompanies soldering, is such that the terminal bar bends downward toward the insulating substrate at all times.

As a result, the occurrence of a clearance between the terminal sections protruding from the terminal bar and the insulating substrate during soldering can be inhibited. Therefore, the phenomenon of the terminal sections separating from the insulating substrate and floating during soldering can be prevented. As a result, solderability is stabilized and the occurrence of connection defects can be prevented.

The embodiment is explained above by way of example, but the configurations of the components described in the embodiment can be replaced with other configurations having same functions. Further, any other desired configurations or production steps may be also added.

The principle of the present invention is described above in a simple manner. A large number of changes or modifications can be made by a person skilled in the art, the present invention is not limited to the specific configurations and application examples illustrated and explained hereinabove, and all corresponding variation examples and equivalents are considered to be included in the scope of the invention defined by the appended embodiments and equivalents thereof.

EXPLANATION OF REFERENCE NUMERALS 1 semiconductor device
11 insulating substrate
12 semiconductor element
20 outer case
20a, 20b side walls
30 terminal bar
31a, 31b surfaces
32-1, 32-2 terminal sections
33-1, 33-2 pressed grooves

What is claimed is:
1. A semiconductor device comprising:
an insulating substrate having a semiconductor element mounted thereon;
an outer case accommodating the insulating substrate; and
a metallic terminal bar disposed above the insulating substrate and fixed to side walls of the outer case at two ends thereof, wherein each of the two ends of the terminal bar at a position close to the side wall of the outer case at a surface on an opposite side to a surface facing the insulating substrate is provided with a pressed groove.

2. The semiconductor device according to claim 1, wherein a recess of the pressed groove is open at the surface on the opposite side to the surface facing the insulating substrate.

3. The semiconductor device according to claim 1, wherein the pressed groove determines a thermal deformation direction so that when soldering a terminal section formed at the terminal bar and the insulating substrate, by heat of the soldering, the terminal bar deforms downward toward the insulating substrate to approach the insulating substrate.

4. The semiconductor device according to claim 1, wherein the outer case has a plurality of terminal bars stacked in a layered configuration with a predetermined spacing therebetween, and the pressed grooves are provided at a same position in the plurality of terminal bars.

5. A semiconductor device manufacturing method comprising:
   accommodating an insulating substrate having a semiconductor element mounted thereon in an outer case having a metallic terminal bar;
   disposing the terminal bar above the insulating substrate so that two ends of the terminal bar are fixed on side walls of the outer case wherein a pressed groove is formed at each of the two ends of the terminal bar at a position close to the side wall of the outer case at a surface on an opposite side to a surface facing the insulating substrate; and
   soldering together a terminal section formed at the terminal bar and the insulating substrate.

6. The semiconductor device manufacturing method according to claim 5, wherein a recess of the pressed groove is open at the surface opposite to the surface facing the insulating substrate.

7. The semiconductor device manufacturing method according to claim 5, wherein the pressed groove determines a thermal deformation direction so that when soldering the terminal section and the insulating substrate, by heat of the soldering, the terminal bar deforms downward toward the insulating substrate to approach the insulating substrate.

8. The semiconductor device manufacturing method according to claim 5, wherein the outer case has a plurality of terminal bars stacked in a layered configuration with a predetermined spacing therebetween, and the pressed grooves are provided at a same position in the plurality of terminal bars.

* * * * *

UNITED STATES PATENT AND TRADEMARK OFFICE
CERTIFICATE OF CORRECTION

| | | |
|---|---|---|
| PATENT NO. | : 8,994,164 B2 | Page 1 of 1 |
| APPLICATION NO. | : 14/351457 | |
| DATED | : March 31, 2015 | |
| INVENTOR(S) | : Hideaki Takahashi et al. | |

It is certified that error appears in the above-identified patent and that said Letters Patent is hereby corrected as shown below:

In the Drawings

Please change S4 in Fig. 14 of Drawing Sheets, from "... THR INSULATING SUBSTRATE" to --THE INSULATING SUBSTRATE--.

In the Specification

Please change column 8, line 8, from "substrate due to heating ..." to --substrate 11 due to heating--.

Signed and Sealed this
Twenty-third Day of June, 2015

Michelle K. Lee
*Director of the United States Patent and Trademark Office*